June 22, 1965 E. SORVILLO 3,191,100

LAMINATED ELECTRIC CIRCUIT MOUNTING BOARDS

Filed March 7, 1963 4 Sheets-Sheet 1

INVENTOR.
Eugene Sorvillo
BY
[signature]
ATTORNEY.

LAMINATED ELECTRIC CIRCUIT MOUNTING BOARDS

Filed March 7, 1963 4 Sheets-Sheet 2

INVENTOR.
Eugene Sorvillo
BY
[signature]
ATTORNEY.

LAMINATED ELECTRIC CIRCUIT MOUNTING BOARDS

INVENTOR.
EUGENE SORVILLO
BY
[signature]
ATTORNEY

June 22, 1965 E. SORVILLO 3,191,100

LAMINATED ELECTRIC CIRCUIT MOUNTING BOARDS

Filed March 7, 1963 4 Sheets-Sheet 4

INVENTOR.
EUGENE SORVILLO
BY
Zoltan Polachek
ATTORNEY 3,191,100
Patented June 22, 1965

3,191,100

LAMINATED ELECTRIC CIRCUIT MOUNTING BOARDS

Eugene Sorvillo, 1957 81st St., Brooklyn, N.Y.
Filed Mar. 7, 1963, Ser. No. 263,465
4 Claims. (Cl. 317—101)

This invention relates to electric circuit mounting boards.

According to the invention there is provided a panel or board having grooves and openings in which electrical wiring can be inserted. A plurality of such panels or boards can be secured together to make up an electrical assembly. The boards may be made of rigid or flexible material.

It is a principal object of the invention to provide means for facilitating the mounting of electrical wiring on a mounting panel or board.

Another object is to provide a multiple board or panel assembly for containing wiring in predetermined arrays.

For further comprehension of the invention, and of the objects and advantages thereof, reference will be had to the following description and accompanying drawings, and to the appended claims in which the various novel features of the invention are more particularly set forth.

In the accompanying drawings forming a material part of this disclosure:

Figures 1, 2, 3, 4:
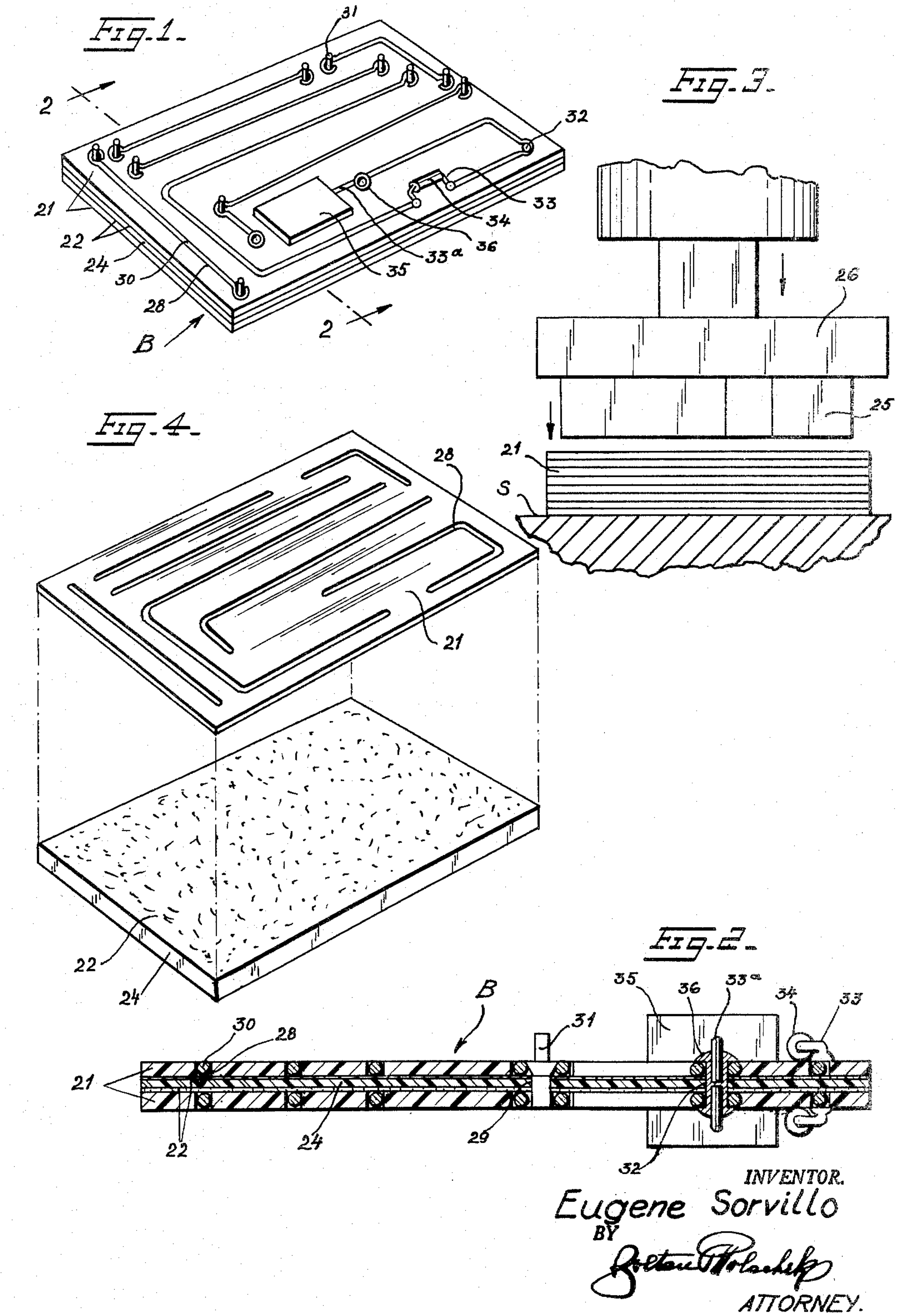
FIG. 1 is a perspective view of a panel assembly embodying the invention.
FIG. 2 is a cross section of an enlarged scale taken on line 2—2 of FIG. 1.
FIG. 3 is a side view partially schematic in form of a pile of panel sheets and slot punching apparatus, illustrating a step in fabrication of panels embodying the invention.
FIG. 4 is an exploded perspective view of parts of a panel.

Referring first to FIGS. 1 and 2, there is shown a panel board assembly B which includes upper and lower panel sheets 21 secured by layers of a suitable adhesive 22 to opposite sides of an insulating and stiffening sheet 24. A pile of sheets 21 can be mounted on a suitable support S as shown in FIG. 3 underneath cutting dies 25 of a press 26. The dies can be forced down through the sheets to cut slots 28 shown in FIGS. 1, 2 and 4. Between each pair of sheets can be inserted an insulation sheet 24 coated with adhesive 22, or the insulation sheet 24 can be attached to a single sheet 21 as indicated in FIG. 4. Thereafter holes 29 can be drilled at predetermined points through the sheets 21 and 24. Wires 30 can be placed in the slots 28 which are closed at one side by sheet 24. The wires fit frictionally and are flush with or below the outer surface of each sheet 21. Ends of the wires can be connected to lugs or terminals 31 inserted in holes 29 for connection to external circuits. Eyelets 32 can be inserted in the holes and leads 33, 33$^a$ of components such as resistor 35 or capacitor 35 can be secured in the eyelets by solder 36.

Figures 5, 6, 6A, 7, 8, 9, 10, 10A:
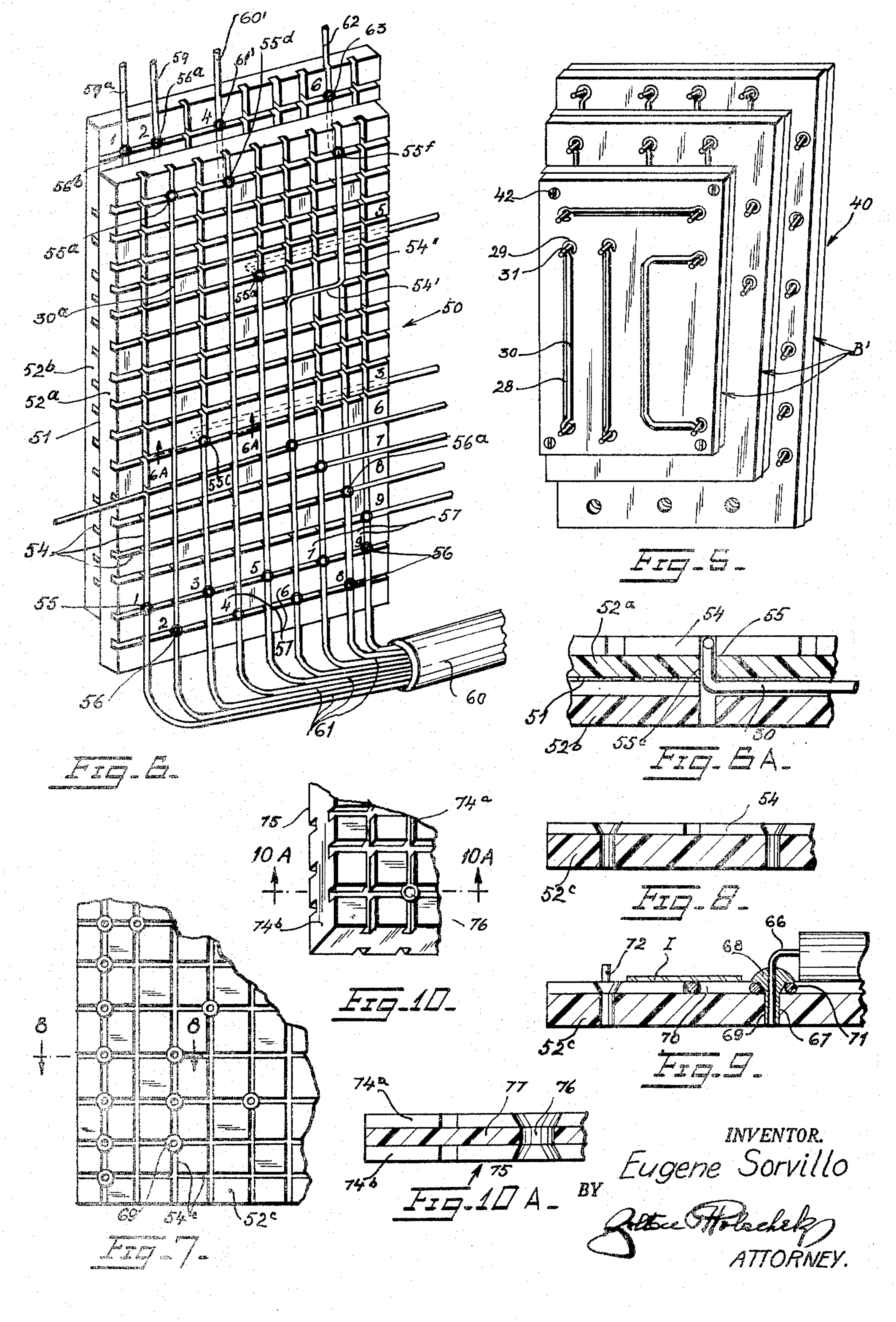
FIG. 5 is a perspective view of another panel assembly according to the invention.
FIG. 6 is a perspective view of still another panel assembly.
FIG. 6A is a sectional view of an enlarged scale taken on line 6A—6A of FIG. 6.
FIG. 7 is a fragmentary plan view of a cross-grooved panel.
FIG. 8 is a sectional view on an enlarged scale taken on line 8—8 of FIG. 7.
FIG. 9 is a sectional view similar to FIG. 8 showing the panel of FIGS. 7 and 8, with components attached.
FIG. 10 is a fragmentary oblique top view of another cross-grooved panel.
FIG. 10A is a sectional view on an enlarged scale taken on line 10A—10A of FIG. 10.

FIG. 5 shows a panel board assembly 40 in which a plurality of panel assemblies B′ of different lengths and width are secured together by screws 42. Terminal lugs 31 are inserted in holes 29 at the ends of slots 28 for connection to external circuits. The sheet 21 in each of panel assemblies B′ is secured to an insulation sheet 24 as explained in connection with FIGS. 1, 2 and 4. Wires 30 are pressed into the slots 28, and terminate at opposite ends in lugs 31.

The panel assemblies can be made in two or more plies or layers. They can be made of hard material such as phenolic plastic, acrylic, hard rubber or the like. They may also be made of soft material such as soft rubber, fiberboard and other insulation materials. The several laminations of a panel board assembly can be secured together by any suitable means such as screws, rivets, glues, etc. If desired, outer surfaces of the panel board assembly can be coated with varnish or other insulation coatings.

In FIGS. 6 and 6A is shown another panel board assembly 50 in which panel boards 52$^a$, 52$^b$ overlap each other. The boards are secured by glue 51. One end of board 52$^a$ extends outwardly beyond board 52$^b$ and the opposite end of board 52$^b$ extends beyond board 52$^a$. Each of the boards is formed with rectangular crossed grooves 54. At certain intersections of the grooves are formed holes 55. The holes in the two boards may be disposed in registration with each other.

A caple 60 has insulated wires 61 dressed in grooves 54 of board 52$^a$. These wires terminate at solder terminals 56. The several terminals can be numbered as indicated by numbers 57 marked on the board. From the terminals 56 other wires 30$^a$ are set in the grooves in various ways. Wire #1, for example, extends laterally out of the assembly at the left for connection to an external circuit. Wire #2 continues up to a hole 55$^a$, then through board 52$^a$ to board 52$^b$. The wire then is connected to solder terminal 56$^a$ on board 52$^b$. From there external wire 59 is connected to an external circuit. A branch of wire #2 is connected to another external circuit via external wire 59$^a$ at solder terminal 56$^b$.

Wire #3 goes through hole 55$_c$ to board 52$_b$ and the extends along a horizontal groove. The wire #3 extends laterally out of the assembly at the right side of the assembly. Wire #4 extends up to hole 55$^d$ and then through this hole to board 52$^b$. External wire 60′ is connected to terminal 61′ of wire #4.

Wire #5 extends up to hole 55$^e$, then through this hole to the board 52$^b$. The wire then extends laterally out of the right side of the assembly.

Wire #6 extends up to a cross groove 54′ and then laterally to a longitudinal groove 54″. The wire extends to hole $55^f$ and through this hole to board $52^b$ where it is connected to external wire 62 at terminal 63.

Wires #7, #8 and #9 are connected between terminals 56 and terminals $56^a$, respectively. Laterally extending wires 64 are connected between terminals $56^a$ and external circuits.

It will be apparent that the cross-grooved arrangement of the superimposed panel boards makes possible many wire dressing arrangements. Wires can cross each other or can be dressed in the same direction.

The panels boards $52^a$ and $52^b$ can have grooves of different widths and depths depending on the diameters of the wires to be fitted in the grooves. Holes can be driller in the boards at all intersections of the cross grooves or at only selected points, where vertical and horizontal grooves intersect. Eyelets can be inserted in the holes if external components are to be connected to the board. Thus in FIG. 9, a resistor 65 has one end lead 66 inserted in eyelet 67 and secured by solder 68 or board $52^c$. The eyelet is set into hole 69 drilled in the board. Wire 70 is dressed around in a loop 71 to connect with the eyelet. FIGS. 7 and 8 show the board $52^c$ prior to insertion of wires 70 into the grooves $54^c$ and insertion of eyelets into holes 69.

If external wire connections are to be made, then terminal lugs 72 can be inserted into the holes 69. The ends of the wires 70 can be looped around these lugs. If desired, crossing wires can be shunted around the rear or underside of the board. This will be done by passing the wires through the holes or eyelets in a manner similar to that employed in FIG. 6.

The panel boards can be cross-grooved on both sides as illustrated in FIGS. 10 and 10A. The grooves $74^a$, $74^b$ on the opposite sides of board 75 are preferably disposed in registration. Holes 76 extend through the board to communicate with grooves on opposite sides of the board. Thicker boards or panel sheets will be used when grooves are formed on both sides to insure sufficient strength to the board structure at the intermediate section 77. The grooves on the opposite sides can have different depths and widths. The cross-grooves can be made by sawing, routing, molding or pressing, depending on the type of material of the board.

The cross-grooved boards can be used for breadboard wiring in experimental work. The bare wire will stay securely in place when pressed or rolled into the grooves. Wires can be cross directed to any desired terminals. The terminals can be used to interconnect other boards or external components. The bare wires can be covered by insulated sheets or by suitable insulation coatings I as indicated in FIG. 9.

The above described cross-grooved panel board assemblies have a number of desirable features.

(1) They act as terminal board assemblies for cables as indicated in FIG. 6.

(2) The wires of the cables can be identified by index numbers or other coded markings on the boards.

(3) When changes must be made between cable wires and terminals on the boards, components connected to the wires need not be disturbed.

(4) Additional panel boards can be added to a laminated assembly as may be required without disturbing other layers.

(5) Tests can be made from one terminal to another on the board without disturbing the cable connections.

(6) The several boards in an assembly can have different thicknesses and different sizes of grooves for receiving wires of different current carrying capacity.

(7) Any one board can have grooves of different sizes for receiving wires of different carrying capacity.

(8) Wired portions of boards can be coated over with suitable coatings for additional insulation, waterproofing, etc.

Figure 11:
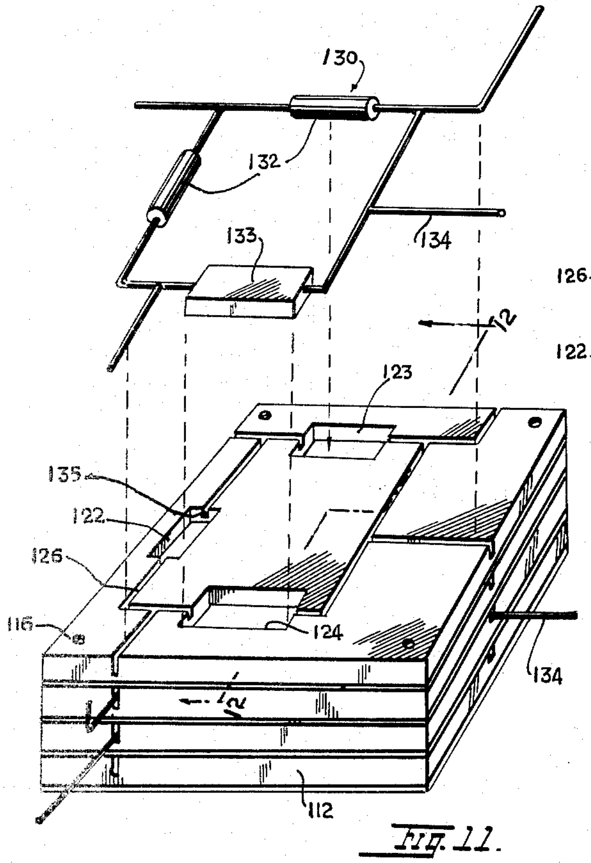
FIG. 11 is an exploded perspective view of a panel assembly embodying the invention.
Figures 12, 18:
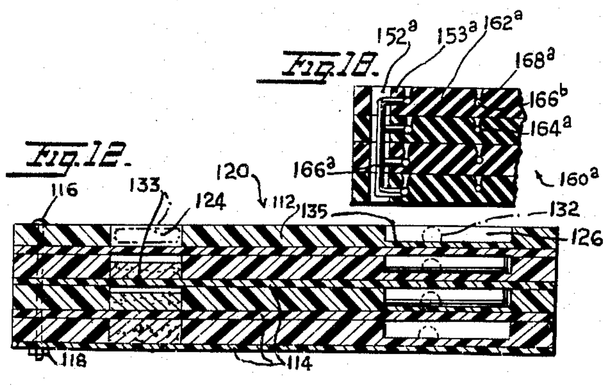
FIG. 12 is a cross-sectional view taken on line 2—2 of FIG. 11.
FIG. 18 is a sectional view similar to FIG. 16 showing a further form of the invention.

In FIGS. 11 and 12, there is shown another assembly 120 including a plurality of rigid rectangular panels or boards 112. Interposed between the boards 112 and under the lower-most one of the boards are thin rigid panels or sheets 114. The assembly is held together by bolts 116 inserted through holes at the corners of the boards and secured by nuts 118.

Each of the boards 112 has a plurality of holes 122, 123 and 124 which are cut out or punched out. These holes may be of different sizes. Connecting the holes are grooves or slots 126. Each of the boards 112 can receive a wired electric circuit 130 such as shown in FIG. 11. The circuit 130 may include resistors 132, capacitor 133 or other electrical components all connected together by wires 133 with leads 134 extending outwardly for connection to other external circuits or for connection to circuits 130 on other boards 112. The sheets 114 serve as spacers, insulators and stiffeners between the boards 112.

Figure 13:
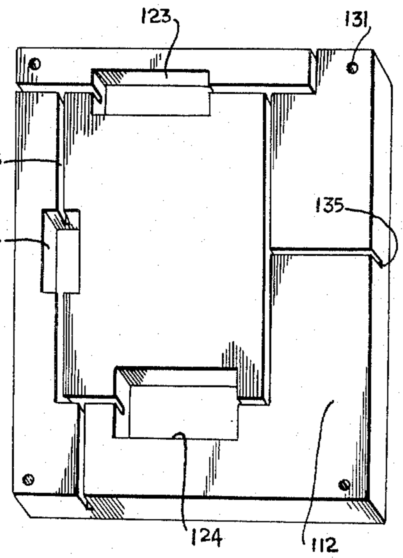
FIG. 13 is a perspective view of a panel or board as used in the assembly of FIGS. 11 and 12.

The corner holes 131 shown in FIG. 13 as well as holes 122–124 can be made in a plurality of boards at the same time by suitable drills and reamers. If the slots 126 are cut through the board then these slots can be made by power jigsaws or bandsaws in a plurality of boards at the same time. Preferably, narrow webs 135 will be left in slots 126 so that the boards do not come apart prior to assembly.

The circuits 130 can be prewired and made ready to insert into the precut and grooved boards 112 as indicated in FIG. 11. The entire assembly 120 thus constitutes in a compact block form a plurality of prewired circuits which may be connected together by their external leads 134.

Figure 15:
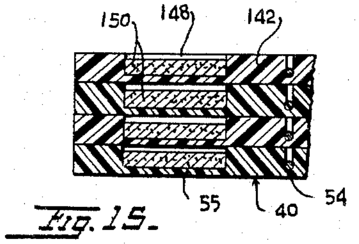
FIG. 15 and FIG. 16 are sectional views respectively taken on lines 15—15 and 16—16 of FIG. 14.
Figure 16:
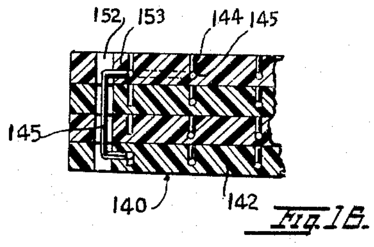
Figure 14:
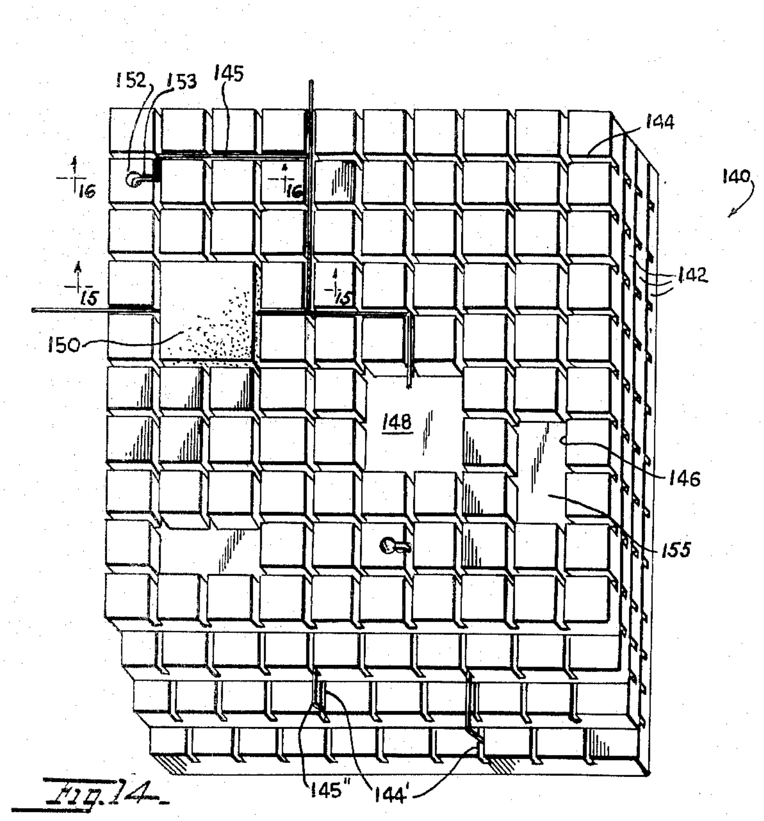
FIG. 14 is a perspective view of another assembly of panels or boards, according to the invention.

In FIGS. 14–16 is shown an assembly 140 including a stack or pile of electric circuit boards 142, each of which has a different length. Each board is provided with a grid of grooves 144 to receive circuit wires 145. Larger or smaller rectangular recesses 146, 148 are provided to receive circuit components 150. Holes 152 can be provided for passing wires 145′ from one panel board to the other without running outside the assembly 140; see FIG. 16. The holes 152 are connected to the grooves 144 by short grooves 153. The grooves and recesses are not cut through the boards. Webs 154, 155 at the bottoms of the grooves and recesses serve as insulation elements to separate wires and electrical components in the several boards. The circuits in the several boards can be connected by wire leads such as leads 145″ which extend out of the ends of upper shorter boards and into groove 144′ in lower longer boards, as shown in FIG. 14.

Figure 19:
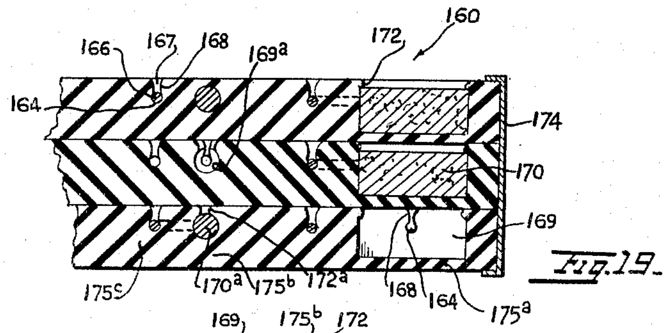
FIG. 19 is a sectional view on an enlarged scale of another panel assembly.
Figure 20:
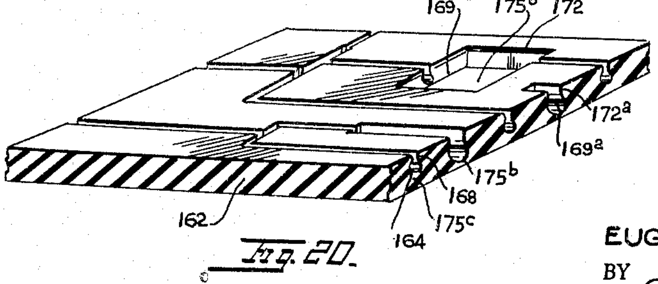
FIG. 20 is a perspective view of part of a panel employed in the assembly of FIG. 19.

In FIGS. 19 and 20 is shown an assembly 160 of panels 162 each of which is formed of flexible rubber or plastic insulation material. Grooves 164 for receiving wires 166 are formed in the upper surface of each panel. These grooves have constricted openings 167 defined by opposing lips 168 at the upper surfaces of the panels. This construction permits wires 166 to be forced into the cylindrical bottoms of the grooves. The lips 168 will retain the wires therein. Rectangular recesses 169 or cylindrical recesses $169^a$ are also formed in the panels to receive electrical circuit components 170, $170^a$. The recesses have overhanging lips 172, $172^a$ which constrict the top openings of the recesses and retain the electrical circuit components in the recesses. Metal clamps 174 can be used to secure the panels 162 together. The bottoms of the recesses and grooves are closed by webs $175^a$–$175^c$.

In FIG. 18 is shown panel assembly $160^a$. Flexible panels $162^a$ are grooved similar to panels 162. Wire $166^a$ passes through holes $152^a$ in the stacked panels to join circuits in the several panels. The holes $152^a$ are connected to grooves $164^a$ by short connecting grooves $153^a$. Circuit wires $166^b$ pass through grooves $164^a$ and are held therein by overhanging lips 168[a] as in panels 162.

Figure 17:
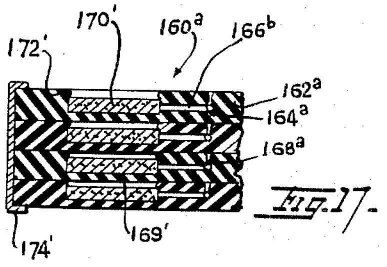
FIG. 17 is a sectional view similar to FIG. 15 showing another form of the invention.

In FIG. 17, assembly 160[a] of flexible panels 162[a] is held together by clamp 174'. Electrical circuit components 170' are seated in recesses 169' in the several panels and are held by the overhanging lips 172'. Wires 166[b] pass through grooves 164[a] and are held in the grooves by opposing lips 168[a] at the constricted openings in the grooves.

If desired, the panels in the several assemblies could be cemented together, or may be attached by rivets or other fastening means. The flexible panels 162, 162[a] can be molded in mass production, plastic or rubber molding machinery at very low cost.

In all forms of the invention described, there is provided a grooved and recessed insulated panel or panels adapted to retain an electrical circuit including wires and electrical components. These panels form compact convenient means for mounting wired circuits in a minimum of time and with a minimum of labor. When panels are provided with a grid of grooves, as shown in FIG. 14, the wires can be dressed in the grooves in any desired manner and need not be limited to any single arrangement. The panels made of flexible material can be provided with grooved grids in the same manner as the rigid panels of FIG. 14.

While I have illustrated and described the preferred embodiments of my invention, it is to be understood that I do not limit myself to the precise constructions herein disclosed and that various changes and modifications may be made within the scope of the invention as defined in the appended claims.

Having thus described my invention, what I claim as new, and desire to secure by United States Letters Patent is:

1. An electrical circuit board comprising a flat panel, said panel having an array of grooves therein for receiving electric wires and a plurality of recesses for receiving electrical components, certain of said grooves communicating with said recesses for connection of certain of said wires to said components, said grooves and recesses having bottom webs to support the wires and components in the grooves, said panel being formed of flexible material, each of said grooves and recesses having a constricted opening defined by opposing lips to retain the wires and circuit components in the grooves and recesses respectively, said lips being sufficiently flexible to permit the wires and circuit components to be pushed past the lips into the grooves and recesses.

2. An electrical circuit board assembly, comprising a plurality of superimposed flat panels, means for securing the panels together, each of said panels being formed of flexible material, said panels having an array of grooves therein for receiving electric wires and a plurality of recesses for receiving electrical components, each of said grooves and recesses having a constricted opening defined by opposing lips to retain wires and circuit components in the grooves and recesses, respectively, each of said grooves and recesses having a constricted opening defined by opposing lips to retain the wires and circuit components in the grooves and recesses, respectively, said lips being sufficiently flexible to permit the wires and circuit components to be pushed past the lips into the grooves and recesses.

3. An electrical circuit board assembly, comprising a plurality of superimposed flat panels, each of said panels being formed of flexible material, each of said panels having grooves and recesses therein, certain of said grooves communicating with the recesses, wires in some of the grooves, electrical components in some of the recesses, some of the wires being connected to said components, each of said grooves and recesses having opposing flexible lips at openings therein to retain the wires and components in the grooves and recesses respectively, said lips being sufficiently flexible to permit the wires and circuit components to be pushed past the lips into the grooves and recesses and to be pulled past the lips out of the grooves and recesses, and means for securing the panels together to form a unitary assembly.

4. A circuit board assembly comprising a flat panel formed of flexible material, said panel having grooves and recesses therein, certain of said grooves communicating with the recesses, wires in some of the grooves, electrical components in some of the recesses, some of the wires being connected to said components, each of said grooves and recesses having opposing flexible lips at openings therein to retain the wires and components in the grooves and recesses respectively, said lips being sufficiently flexible to permit the wires and circuit components to be pushed past the lips into the grooves and recesses and to be pulled past the lips out of the grooves and recesses.

References Cited by the Examiner

UNITED STATES PATENTS

| | | | |
|---|---|---|---|
| 2,019,625 | 11/35 | O'Brien | 339—17 |
| 2,474,988 | 7/49 | Sargrove | 317—101 |
| 2,932,772 | 4/60 | Bowman et al. | 339—18 |
| 2,937,358 | 5/60 | Bulger | 317—101 |
| 2,981,868 | 4/61 | Severson | 317—101 |
| 3,102,213 | 8/63 | Bedson et al. | 317—101 |

LARAMIE E. ASKIN, *Primary Examiner.*

JOHN F. BURNS, DARRELL L. CLAY, *Examiners.*